United States Patent
Chung et al.

(10) Patent No.: US 8,679,984 B2
(45) Date of Patent: Mar. 25, 2014

(54) METHOD OF MANUFACTURING ELECTRIC DEVICE, ARRAY OF ELECTRIC DEVICES, AND MANUFACTURING METHOD THEREFOR

(75) Inventors: Jong Won Chung, Hwaseong-si (KR); Christopher J. Bettinger, Boston, MA (US); Zhenan Bao, Stanford, CA (US); Do Hwan Kim, Anyang-si (KR); Bang Lin Lee, Suwon-si (KR); Jeong Il Park, Seongnam-si (KR); Yong Wan Jin, Seoul (KR); Sang Yoon Lee, Seoul (KR)

(73) Assignees: Samsung Electronics Co., Ltd., Gyeonggi-Do (KR); The United States of America as represented by the National Institutes of Health (NIH), Washington, DC (US); The United States of America as represented by the Dept. of Health and Human Services (DHHS), Washington, DC (US)

( * ) Notice: Subject to any disclaimer, the term of this patent is extended or adjusted under 35 U.S.C. 154(b) by 182 days.

(21) Appl. No.: 13/173,986

(22) Filed: Jun. 30, 2011

(65) Prior Publication Data

US 2013/0001554 A1    Jan. 3, 2013

(51) Int. Cl.
*H01L 21/461*    (2006.01)

(52) U.S. Cl.
USPC .................. 438/720; 438/742; 438/754

(58) Field of Classification Search
USPC .......................... 438/720, 742, 754
See application file for complete search history.

(56) References Cited

U.S. PATENT DOCUMENTS

| 6,872,588 | B2 | 3/2005 | Chabinyc et al. |
| 2002/0145231 | A1 | 10/2002 | Quake et al. |
| 2008/0035207 | A1 | 2/2008 | Lamers et al. |
| 2008/0061288 | A1 * | 3/2008 | Tomono et al. ............ 257/40 |
| 2009/0050206 | A1 | 2/2009 | Halls et al. |
| 2010/0207113 | A1 * | 8/2010 | Kasahara ................... 257/40 |

FOREIGN PATENT DOCUMENTS

| JP | 2009001486 A | 1/2009 |
| KR | 1020080014672 | 2/2008 |

OTHER PUBLICATIONS

C.J. Bettinger et al., "Microfluidic Arrays for Rapid Characterization Thin-Film Transistor Performance" Advanced Materials (2011), XX, 1-5.
"Effects of Thermal Annealing on the Morphology of Polymer-Fullerene Blends for Organic Solar Cells" SSRL Science Highlight—2011.

* cited by examiner

*Primary Examiner* — James Mitchell
(74) *Attorney, Agent, or Firm* — Harness, Dickey & Pierce, P.L.C.

(57) ABSTRACT

An example embodiment relates to a method of manufacturing an array of electric devices that includes attaching a platform including a micro-channel structure to a substrate. The method includes injecting first and second solutions into the micro-channel structure to form at least three liquid film columns, where the first and second solutions include different solvent composition ratios and the liquid columns each, respectfully, include different solvent composition ratios. The method further includes detaching the platform the substrate, removing solvent from the liquid film columns to form thin film columns, and treating the thin film columns under different conditions along a length direction of the thin film columns. The solvent is removed from the thin film columns and the thin film columns are treated under different conditions along a length direction of the thin film columns.

19 Claims, 24 Drawing Sheets

METHOD OF MANUFACTURING ELECTRIC DEVICE, ARRAY OF ELECTRIC DEVICES, AND MANUFACTURING METHOD THEREFOR

FEDERALLY SPONSORED RESEARCH OR DEVELOPMENT

This invention was made with Government support under contract NS064771 awarded by the National Institutes of Health and under contract N00014-08-1-0654 awarded by the Office of Naval Research. The Government has certain rights in this invention.

BACKGROUND

1. Field

Some example embodiments relate to a method of manufacturing an electric device, an array of electric devices thereof, and/or a manufacturing method thereof.

2. Description of the Related Art

Organic materials, such as organic semiconductors, may be used in light emitting diodes (LEDs), display devices, photovoltaics, radiofrequency devices, sensors, and the like. Solution processes may be used to form flexible and inexpensive electric devices that include organic semiconductors.

The processing conditions of solution processes may affect the electrical performance of devices based on organic semiconductors. Parameters such as solvent composition, solute concentration, evaporation conditions, and annealing temperature may affect factors such as the molecular packing, orientation, morphology, and crystallinity of films. These factors may affect the performance of electric devices such as organic thin film transistors (OTFTs) and solar cells.

Therefore, the performance of electric devices based on organic semiconductors may be evaluated as functions of these factors, and the evaluation result may be used in manufacturing electric devices.

SUMMARY

A method of manufacturing an array of electric devices according to an example embodiment includes: forming a platform including a micro-channel structure; attaching the platform to a substrate; injecting first and second solutions having different composition ratios into the micro-channel structure to form at least three liquid film columns having different composition ratios on the substrate; detaching the platform from the substrate; removing solvent from the liquid film columns to form thin film columns; and treating the thin film columns under different conditions along length direction of the thin film columns.

The thin film columns may include at least one organic semiconductor, and the method may further include: forming a plurality of electrodes contacting the thin film columns.

The treatment of the thin film columns may include: annealing the thin film columns under different temperatures.

The annealing may be performed such that annealing temperature varies gradually along the thin film columns by making a first end of the substrate including the thin film columns contact a hot plate and a second end of the substrate opposite the first end maintain at a temperature lower than a temperature of the hot plate.

The plurality of electrodes may include a source electrode and a drain electrode opposite each other relative to a length direction of the thin film columns.

The first solution and the second solution may include the at least one organic semiconductor in common, the first solution may further include a first solvent, and the second solution may further include a second solvent.

The at least one organic semiconductor may include poly (didodecylquaterthiophene-alt-didodecylbithiazole), the first solvent may include chlorobenzene, and the second solvent may include chloroform.

The plurality of electrodes may be disposed on and under the thin film columns.

The at least one organic semiconductor may include a p-type organic semiconductor and an n-type organic semiconductor, the first solution and the second solution may include a solvent in common, the first solution may further include the p-type organic semiconductor as a solute, and the second solution may further include the n-type organic semiconductor as a solute.

The p-type organic semiconductor may include at least one of pentacene, copper phthalocyanine (CuPc), tetracyanoquinodimethane (TCNQ), 6,13-bis(triisopropylsilylethynyl) (TIPS) pentacene, poly(3-hexylthiophene) (P3HT), polyphenylene vinylene (PPV), poly[2,5-bis(3-alkylthiophen-2-yl)thieno(3,2-b)thiophene](PBTTT), the n-type organic semiconductor may include at least one of phenyl-C61-butyric acid methyl ester (PCBM), C60, and perylenediimide (PDI) derivatives, and the solvent may include at least one of chlorobenzene, chloroform, toluene, benzene, tetrahydrofuran (THF), $CCl_4$, methylenechloride, and ethylacetate.

An array of organic electric devices according to an example embodiment includes: a substrate; a plurality of organic semiconductor thin film columns disposed on the substrate; and a plurality of pairs of electrodes disposed on the substrate and contacting the thin film columns, wherein different thin film columns have different morphology, and morphology of each of the thin film columns vary along a length direction of the thin film columns.

A method of manufacturing an organic electric device according to an example embodiment includes: selecting solvent and solute; forming a thin film of an organic semiconductor on a first substrate by a solution process using the selected solvent and solute; and forming a pair of first electrodes contacting the thin film, wherein the selection includes: forming a platform including a micro-channel structure; attaching the platform to a second substrate; injecting first and second solutions having different composition ratios into the micro-channel structure to form at least three liquid film columns having different composition ratios on the second substrate; detaching the platform from the second substrate; removing solvent from the liquid film columns to form thin film columns; treating the thin film columns under different conditions along length direction of the thin film columns; forming a plurality of second electrodes contacting the thin film; testing characteristics of test organic electric devices in an array of the test organic electric devices including the thin film columns and the second electrodes; and selecting the solvent and solute based on the test.

The treatment of the thin film columns may include: annealing the thin film columns under different temperatures.

The annealing may be performed such that annealing temperature varies gradually along the thin film columns by making a first end of the substrate including the thin film columns contact a hot plate and a second end of the second substrate opposite the first end maintain at a temperature lower than a temperature of the hot plate.

The plurality of second electrodes may include a source electrode and a drain electrode opposite each other relative to a length direction of the thin film columns.

The first solution and the second solution may include the at least one organic semiconductor in common, the first solution may further include a first solvent, and the second solution may further include a second solvent.

The at least one organic semiconductor may include poly (didodecylquaterthiophene-alt-didodecylbithiazole), the first solvent may include chlorobenzene, and the second solvent may include chloroform.

The plurality of second electrodes may be disposed on and under the thin film columns.

The at least one organic semiconductor may include a p-type organic semiconductor and an n-type organic semiconductor, the first solution and the second solution may include a solvent in common, the first solution may further include the p-type organic semiconductor as a solute, and the second solution may further include the n-type organic semiconductor as a solute.

The p-type organic semiconductor may include at least one of pentacene, copper phthalocyanine (CuPc), tetracyanoquinodimethane (TCNQ), 6,13-bis(triisopropylsilylethynyl) (TIPS) pentacene, poly(3-hexylthiophene) (P3HT), polyphenylene vinylene (PPV), poly[2,5-bis(3-alkylthiophen-2-yl)thieno(3,2-b)thiophene](PBTTT), the n-type organic semiconductor may include at least one of phenyl-C61-butyric acid methyl ester (PCBM), C60, and perylenediimide (PDI) derivatives, and the solvent may include at least one of chlorobenzene, chloroform, toluene, benzene, tetrahydrofuran (THF), $CCl_4$, methylenechloride, and ethylacetate.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other features and advantages of some example embodiments will be apparent from the more particular description of non-limiting example embodiments, as illustrated in the accompanying drawings in which like reference characters refer to the same parts throughout the different views. The drawings are not necessarily to scale, emphasis instead being placed upon illustrating the principles and concepts of some example embodiments. In the drawings.

DETAILED DESCRIPTION

Figure 1:
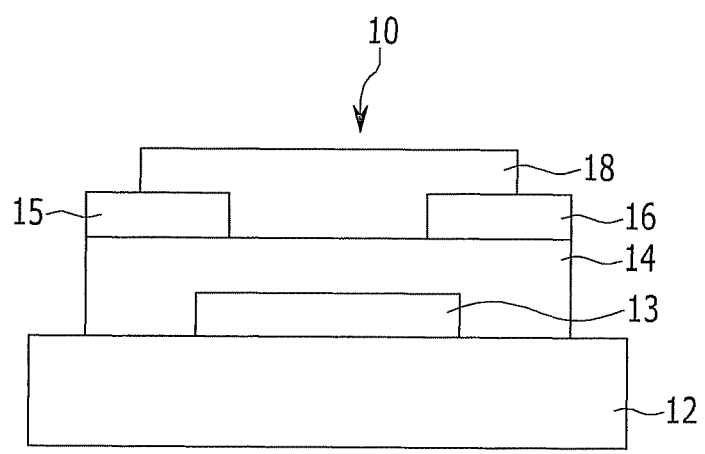
FIG. 1 is a schematic sectional view of an OTFT according to an example embodiment.

Example embodiments will be described more fully hereinafter with reference to the accompanying drawings, in which some example embodiments are shown. Example embodiments, may, however, be embodied in many different forms and should not be construed as being limited to the embodiments set forth herein; rather these example embodiments are provided so that this disclosure will be thorough and complete, and will fully convey concepts of example embodiments to those of ordinary skill in the art. In the drawing, parts having no relationship with the explanation are omitted for clarity. The thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps; operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
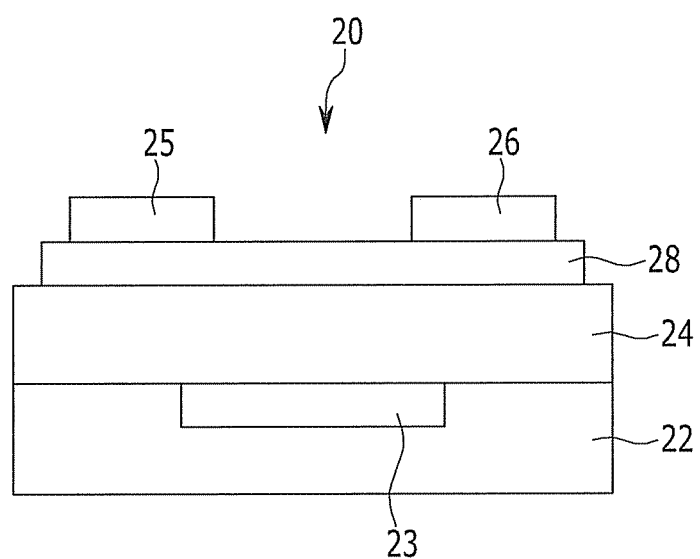
FIG. 2 is a schematic sectional view of an OTFT according to an example embodiment.

In FIGS. 1 and 2, OTFTs according to some example embodiments are described.

Referring to FIG. 1, an OTFT 10 according to an example embodiment includes a gate electrode 13, an insulating layer 14, a source electrode 15 and a drain electrode 16, and an organic semiconductor film 18 disposed in sequence on a substrate 12. The substrate 12 may be a transparent substrate.

Referring to FIG. 2, an OTFT 20 according to an example embodiment may be disposed on, for example, a single crystalline silicon substrate 22. An impurity region 23, for example, containing n-type impurity of high concentration is formed in the substrate 22. An insulating layer 24, organic semiconductor film 28, source electrode 25, and drain electrode 26 may be disposed in sequence on the substrate 22. The impurity region 23 may serve as a gate electrode.

OTFTs according to some example embodiments may have a variety of structures in addition to those shown in the OTFTs 10 and 20 of FIGS. 1 and 2.

The organic semiconductor films 18 and 28 may be formed by solution processes. The organic semiconductor films 18 and 28 may include a $\pi$-conjugated monomer or polymer for the semiconductor. Examples of the semiconductors are poly (didodecylquaterthiophene-alt-didodecylbithiazole)(referred to as "PQTBTz-C12" hereinafter), pentacene, 6,13-bis (triisopropylsilylethynyl) pentacene (TIPS pentacene), poly (3-hexylthiophene) (P3HT), buckminsterfullerene (C60), and propionamidotetralin (PDOT). A solvent for the solution process may include an organic solvent in which the semiconductor can be dissolved. Examples of the organic solvent are chlorobenzene, chloroform, toluene, benzene, tetrahydrofuran (THF), $CCl_4$, methylenechloride, ethylacetate, and a combination thereof.

The gate electrode 13, the insulating layer 14 and 24, the source electrode 15 and 25, or a drain electrode 16 and 26 may also be an organic thin film formed by a solution process.

The organic thin films may be formed by using a solution obtained by dissolving an organic material in a solvent composition selected by a following material selection process.

FIGS. 3 to 10 illustrate a method of manufacturing an array of OTFTs for evaluating the characteristics of organic thin films according to an example embodiment.

Figure 3:
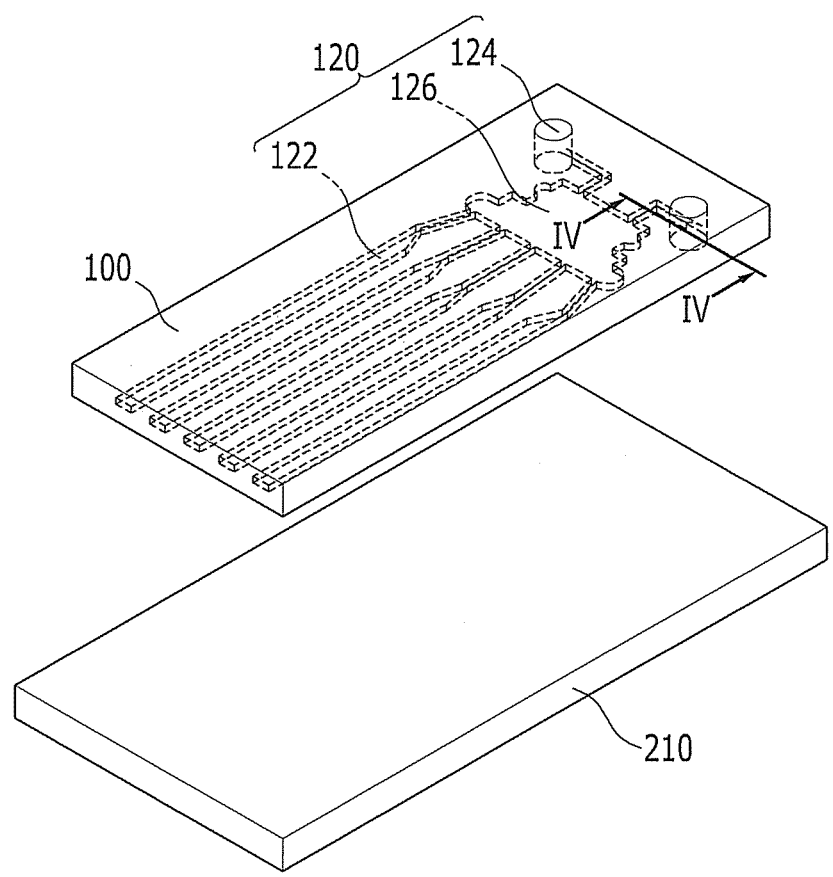
FIG. 3 is a schematic perspective view showing a first step of a method of manufacturing an array of electric devices for characteristic evaluation according to an example embodiment.
Figure 3A:
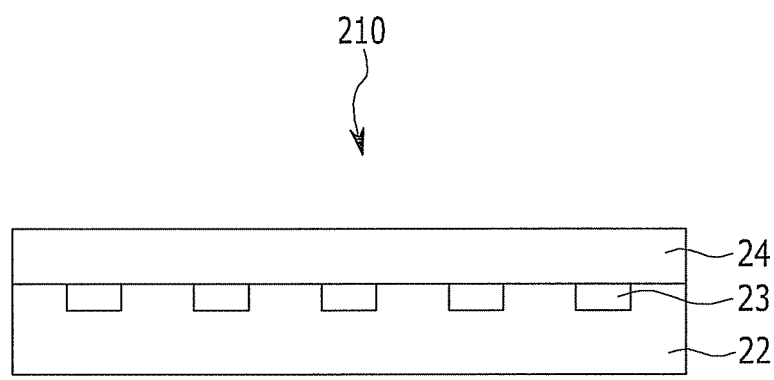
FIG. 3A is a sectional view illustrating the structure of a test substrate according to an example embodiment.
Figure 3B:
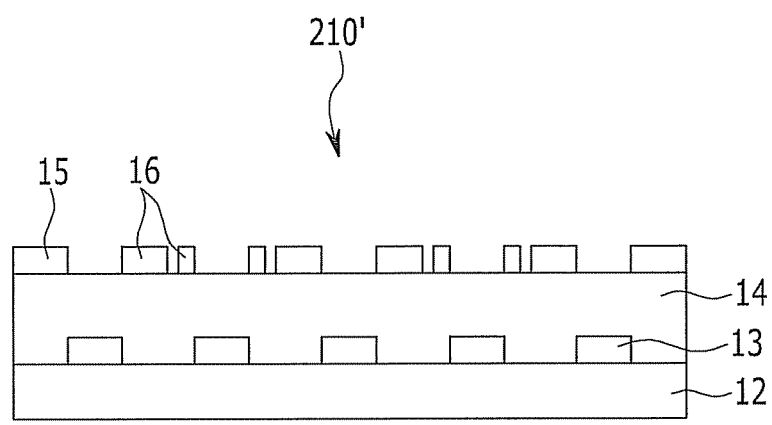
FIG. 3B is a sectional view illustrating the structure of a test substrate according to another example embodiment.
Figure 3C:
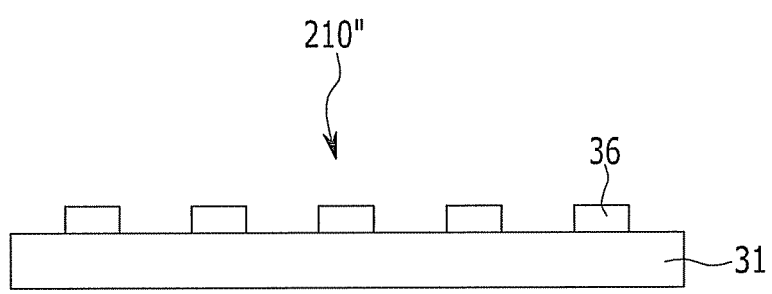
FIG. 3C is a sectional view illustrating the structure of a test substrate according to another example embodiment.
Figure 4:
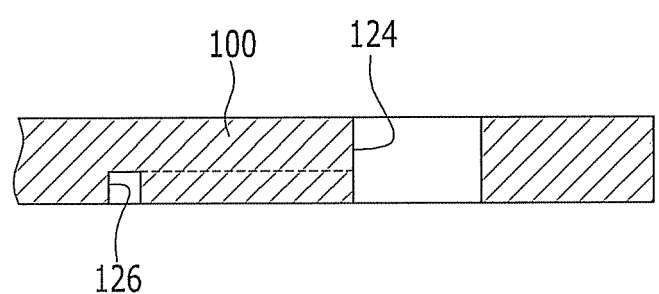
FIG. 4 is a sectional view of a platform shown in FIG. 3 taken along a line IV-IV of FIG. 3.
Figure 5:
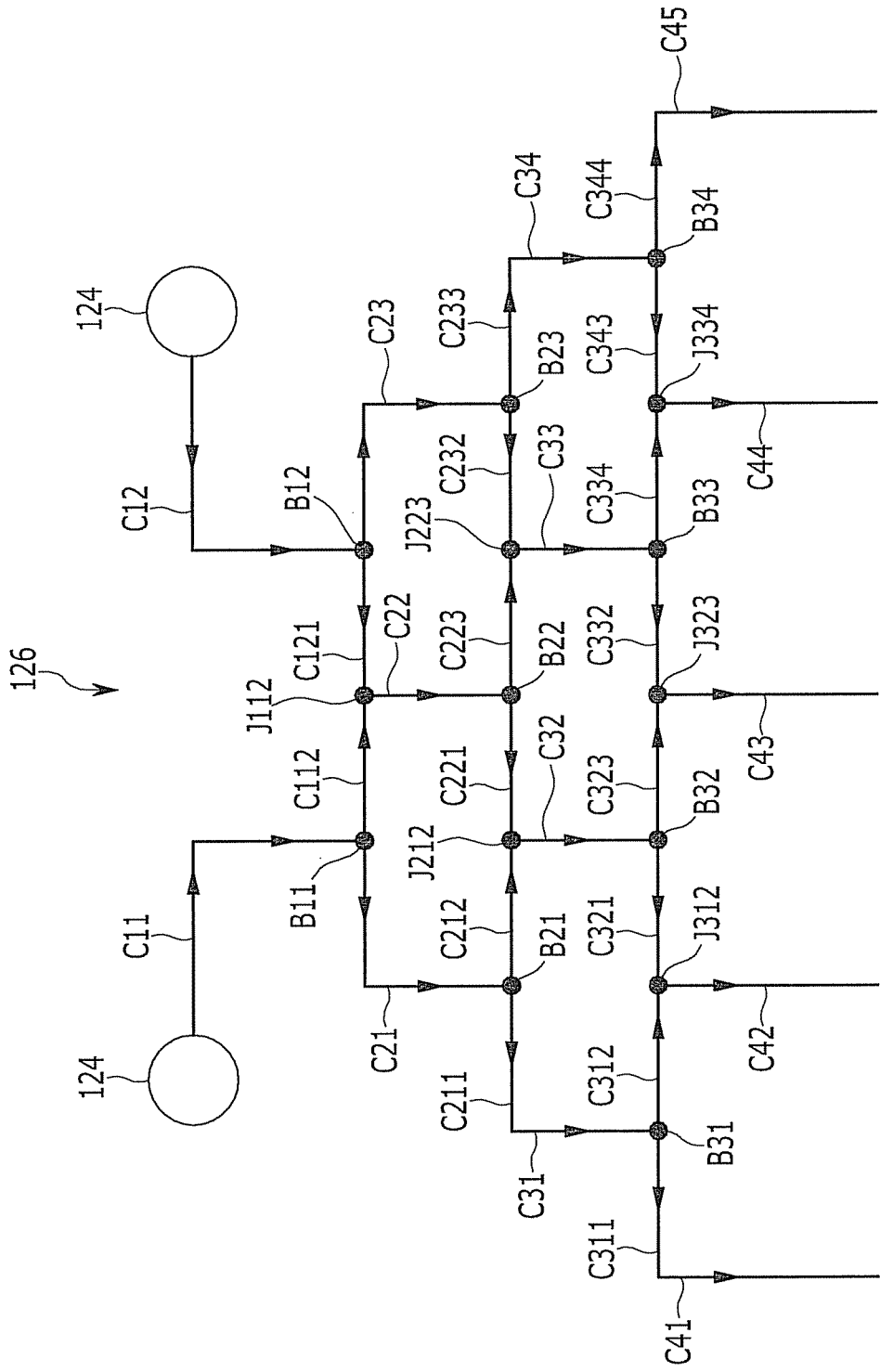
FIG. 5 illustrates a branch-off portion of a microchannel structure of the platform shown in FIG. 3.
Figure 6:
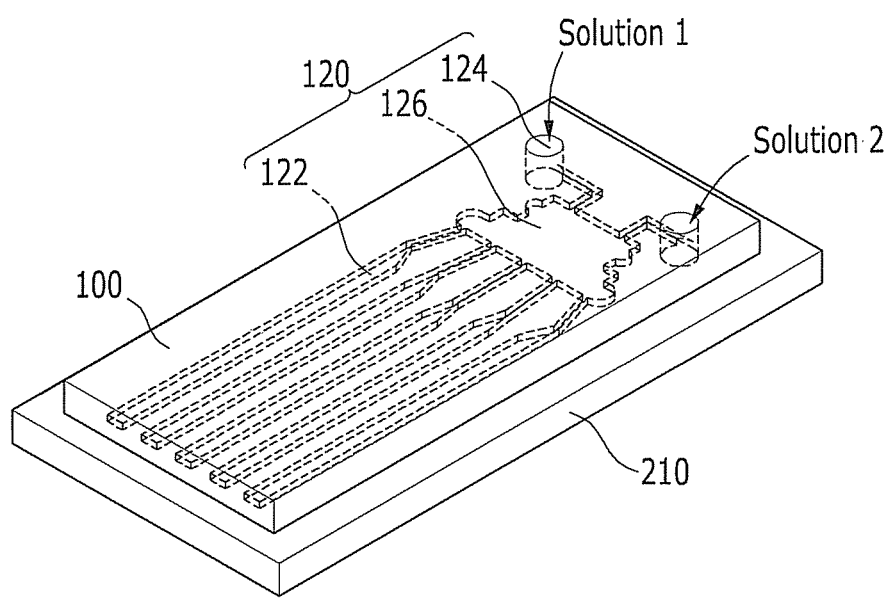
FIG. 6 is a schematic perspective view showing a step following the step shown in FIG. 3 according to an example embodiment.
Figure 7:
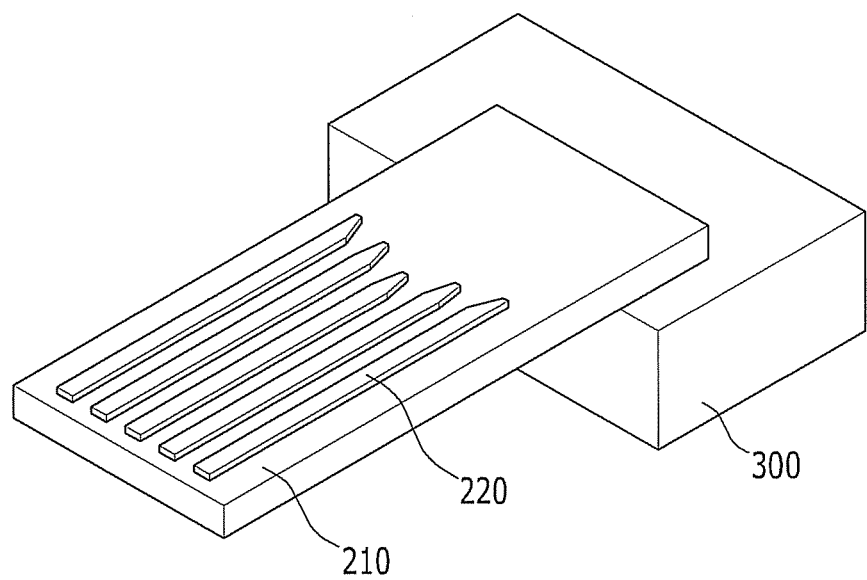
FIG. 7 is a schematic perspective view showing a step following the step shown in FIG. 6 according to an example embodiment.
Figure 8:
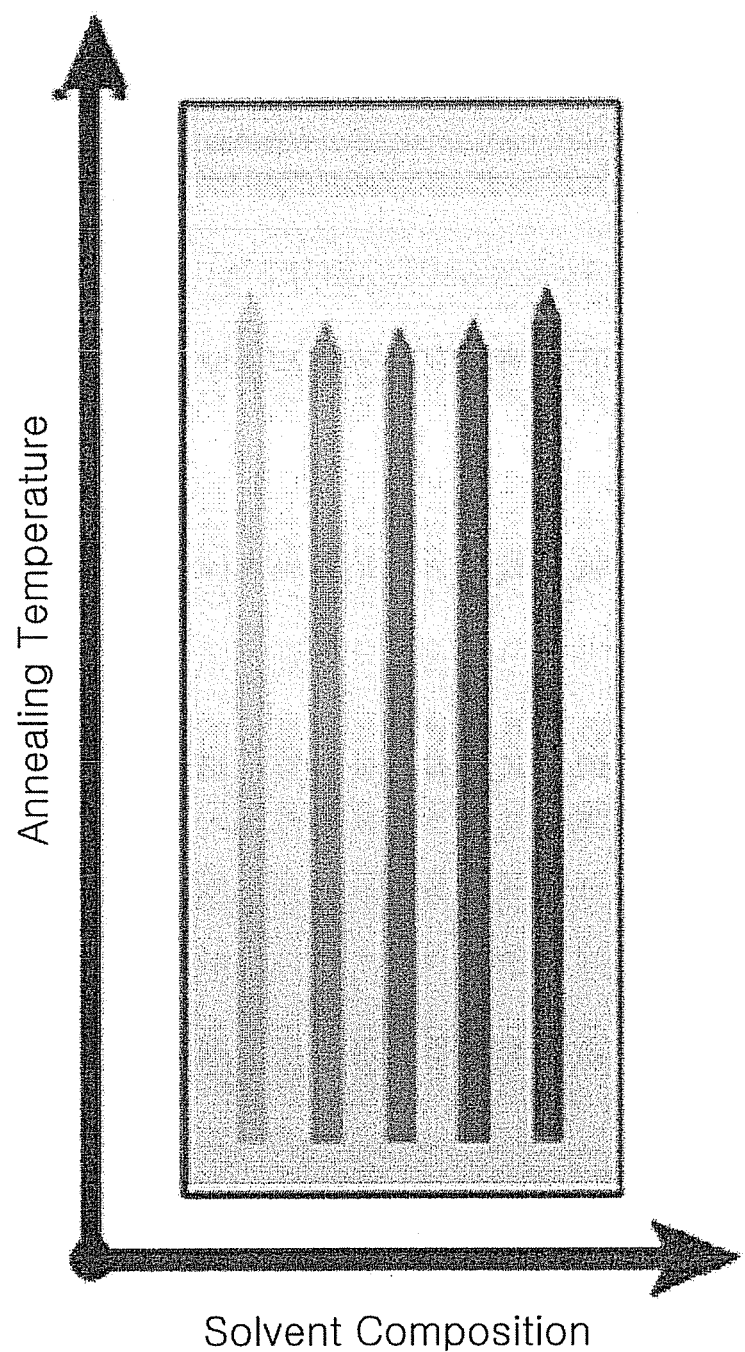
FIG. 8 illustrates solvent composition ratio and annealing temperature of thin film columns formed in the step shown in FIG. 7.
Figure 9:
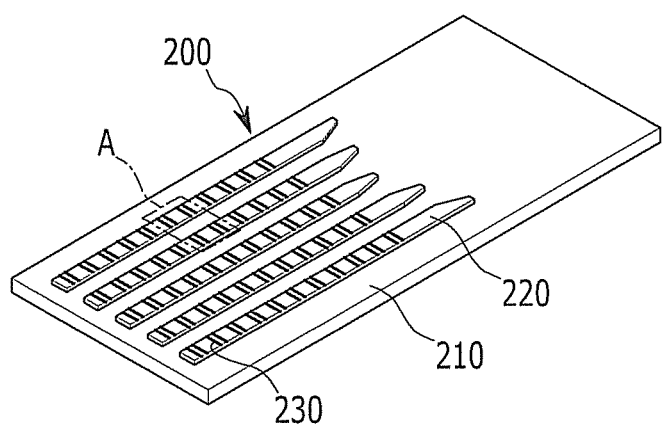
FIG. 9 is a schematic perspective view showing a step following the step shown in FIG. 7 according to an example embodiment.
Figure 10:
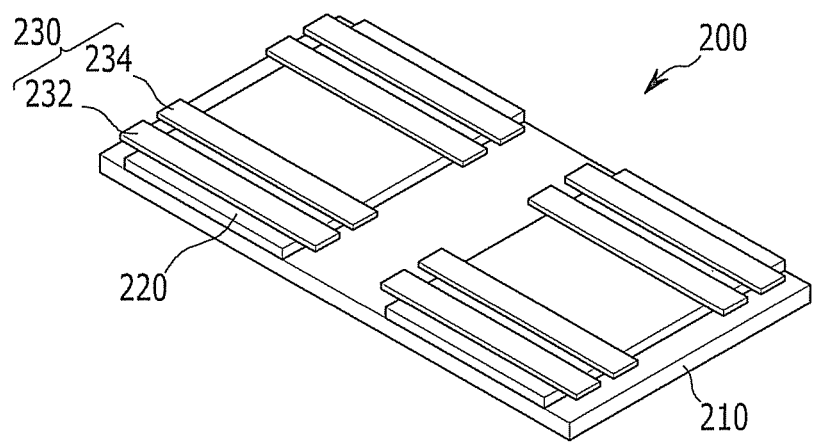
FIG. 10 is a magnified sectional view of a portion A shown in FIG. 9.

FIG. 3 is a schematic perspective view showing a first step of a method of manufacturing an array of electric devices, such as an array of OTFTs and/or an array of organic solar cells, for characteristic evaluation according to an example embodiment. FIGS. 3A to 3C illustrate the structure of a test substrate according to some example embodiments. FIG. 4 is a sectional view of a platform taken along the line IV-IV of FIG. 3. FIG. 5 illustrates a branch-off portion of a microchannel structure of the platform shown in FIG. 3. FIG. 6 is a schematic perspective view showing a step following the step shown in FIG. 3 according to an example embodiment. FIG. 7 is a schematic perspective view showing a step following the step shown in FIG. 6 according to an example embodiment. FIG. 8 illustrates solvent composition ratio and annealing temperature of thin film columns formed in the step shown in FIG. 7. FIG. 9 is a schematic perspective view showing a step following the step shown in FIG. 7 according to an example embodiment, and FIG. 10 is a magnified sectional view of a portion A shown in FIG. 9.

Referring to FIG. 3, a test substrate 210 and a platform 100 provided with a microchannel structure 120 are prepared. The platform 100 is attached to the test substrate 210. The platform 100 may include, for example, poly(fluoro polyether) (PFPE). The microchannel structure 120 may include a pair of injection holes 124, a branch-off portion 126, and a column portion 122 connected in series.

Referring to FIG. 4, the injection holes 124 may pass through the platform 100. The branch-off portion 126 may be formed as trenches in the bottom of the platform 100.

The column portion 122 includes a plurality of columns that may have a rectilinear shape (or substantially rectilinear) and may extend in a longitudinal direction.

Referring to FIG. 5, the branch-off portion 126 is a passage that connects the injection holes 124 and the column portion 122. The branch-off portion 126 includes a plurality of main passages Cij (where i and j are natural numbers) and a plurality of branch-offs Cklm (where k, l, and m are natural numbers).

The main passages Cij may form a plurality of stages. In reference character Cij, the index i denotes the stage number and the index j denotes the order from the left. The number of the main passages Cij may increase by one as the order of the stage increases by one. For example, the first stage may include two main passages C11 and C12, the second stage may include three main passages C21, C22, and C23, the third stage may include four main passages C31, C32, C33, and C34, and the fourth stage may include five main passages C41, C42, C43, C44, and C45. Although FIG. 5 shows four stages from the first to fourth stages, the number of the stages may be changed to more or fewer stages. Hereinafter, the main passages of the i-th stage may be abbreviated to the i-th main passages.

The first main passages, C11 and C12, are connected to the injection holes 124. The last main passages, C41, C42, C43, C44 and C45, are connected to respective columns in the column portion 122.

Except for the last main passages, C41, C42, C43, C44, and C45, each of the main passages Cij may branch off to two branch-offs Cijp (p=j−1, j, or j+1) at a branching point Bij. For example, a second main passage C21 branches into two branch-offs C211 and C212 at a branching point B21, and a second main passage C22 branches into two branch-offs C221 and C223 at a branching point B22. However, each of the main passages Cij may branch into three or more branch-offs. Hereinafter, a branch-off of the i-th stage may be abbreviated to "an i-th branch-off."

Among the branch-offs Cklm of each stage, two outermost branch-offs $C_{k11}$ and $C_{k,k+1,k+1}$ may be connected to respective main passes $C_{k+1,1}$ and $C_{k+1,k+2}$ of the next stage as they are. For example, the leftmost branch-off C211 of the second stage may be connected to the leftmost main passage C31 of the third stage, and the rightmost branch-off C223 of the second stage may be connected to the rightmost main passage C34 of the third stage.

Intermediate branch-offs Cklm among the branch-offs Cklm of each stage meet adjacent brach-offs Ckml at joints Jklm, and the main passages of the next stage start from the joints Jklm.

The main passages Cij and the brach-offs Cklm shown in FIG. 5 are rectilinear (or substantially rectilinear), but their shapes are not limited thereto, but may be curved or serpentine.

Referring to FIG. 3A, the test substrate 210 illustrated in FIG. 3 may include a structure the same as (or substantially similar to) the structure underlying the organic semiconductor film 28 shown in FIG. 2. The test substrate 210 illustrated in FIG. 3A may includes a substrate 22, a plurality of impurity regions 23, and an insulating layer 24. The plurality of impurity regions 23 are spaced apart to align with the column portions 122 shown in FIG. 3 when the platform 100 and the test substrate 210 are joined. The insulating layer 24 may include $SiO_2$ treated by using phenyltrichlorosilane ($C_6H_5SiCl_3$) (PTS).

Alternatively, in another example embodiment as shown in FIG. 3B, a test substrate 210' may include a structure that is the same as (or substantially similar to) the structure underlying organic semiconductor film 18 shown in FIG. 1. The test substrate 210' shown in FIG. 3B includes a substrate 12, a plurality of gate electrodes 13, an insulating layer 14, and a plurality of pairs of source electrodes 15 and drain electrodes 16. The gate electrodes 13 and pairs of source electrodes 15 and drain electrodes 16 are spaced apart to align with the column portions 122 shown in FIG. 3 when the platform 100 and test substrate 210' are joined.

Figure 21:
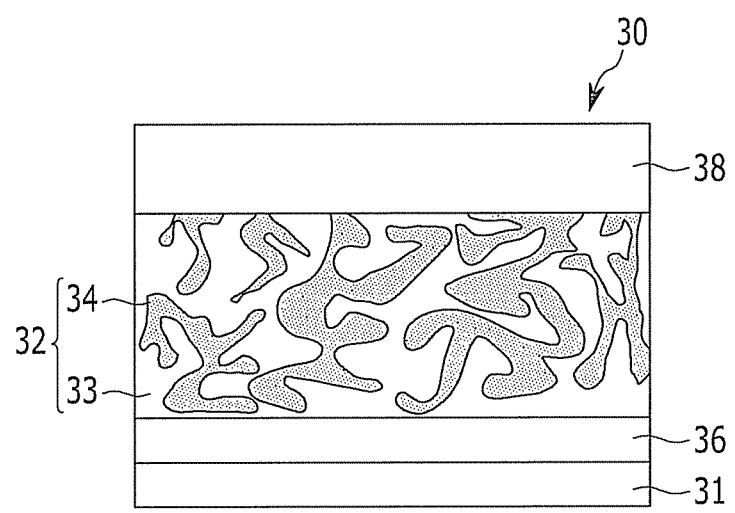
FIG. 21 is a schematic sectional view of an organic solar cell according to an example embodiment.

Alternatively, in another example embodiment as shown in FIG. 3C, a test substrate 210" may include a structure that is the same as (or substantially similar to) the structure underlying the semiconductor layer 32 shown in FIG. 21. The test substrate 210" shown in FIG. 3C includes a substrate 31, a plurality of lower electrodes 36. The lower electrodes 36 are spaced apart to align with the column portions 122 shown in FIG. 3 when the platform 100 and test substrate 210" are joined.

The platform 100 is attachable to and detachable from the test substrate 210 (or 210' or 210") reversibly.

Referring to FIG. 6, the platform 100 is joined with test substrate 210. Two solutions that contain at least one organic semiconductor, solution 1 and solution 2, are injected into respective injection holes 124 of the platform 100. A solvent composition ratio of solution 1 may be different than a solvent composition ratio of solution 2.

An example of the organic semiconductor contained in the solution 1 and the solution 2 may be PQTBTz-C12. However, the organic semiconductor may include at least one of pentacene, TIPS pentacene, P3HT, C60, and PDOT.

The solution 1 may include chlorobenzene (abbreviated to "CB") as a solvent, and the solution 2 may include chloroform (abbreviated to "Ch"). CB and Ch have a wide range of evaporation rates that is significant to the performance of the thin film transistor.

Other examples of solvents in the solution 1 and the solution 2 may be toluene, benzene, THF, $CCl_4$, methylenechloride, ethylacetate, etc.

Then, solutions 1 and solutions 2 may flow along the branch-off portion 126 to be mixed, and thus resultant solutions flowing into the columns of the column portion 122 may contain solvents having respective composition ratios that are different from one another.

Referring to FIG. 5, the solution 1 is injected into a left injection hole 124, while the solution 2 is injected into a right injection hole 124. The solvent in a solution flowing through the main passage C11 may contain 100% CB, and the solvent in a solution flowing through the main passage C12 may contain 100% Ch. At a branching point B11 or B12, each of the solution 1 and the solution 2 bifurcates. Portions of the solution 1 and the solution 2 flowing in the branch-offs C112 and C121 join at the joins J112 to form a new solution having a composition ratio different from the solution 1 and the solution 2, and the new solution may flow in the second main passage C22. For example, when the shapes of the branch-offs C112 and C121 are the same (or substantially the same)

and the physical characteristics such as viscosity of the solution 1 and the solution 2 are also the same (or substantially the same), the solution in the second main passage C22 may contain about 50% CB and about 50% Ch.

At the second stage, the solution in the left main passage C21 may contain about 100% CB, and the solution in the right main passage C23 may contain about 100% Ch.

Likewise, the solutions flowing the four main passages C31, C32, C33, and C34 in the third stage may contain about 100% CB, about 75% CB+about 25% Ch, about 25% CB+about 75% Ch, and about 100% Ch in sequence from the left. Furthermore, the five main passages C41, C42, C43, C44, and C45 of the fourth stage may contain about 100% CB, about 87.5% CB+about 12.5% Ch, about 50% CB+about 50% Ch, about 12.5% CB+about 87.5% Ch, and about 100% Ch in sequence from the left. Therefore, the resultant composition ratio of CB:Ch in the solutions in the five columns of the column portion 122 may be about 100:0, about 87:13, about 50:50, about 13:87, and about 0:100.

Next, referring to FIG. 7, the solvents in liquid films formed in the column portion 122 of the platform 100 may be removed by an evaporation process to form a plurality of columns 220 of organic semiconductor thin films on the test substrate 210, each organic semiconductor thin film containing at least one organic semiconductor. Obtaining the thin film columns 220 by evaporating a solvent from a solution may approximate the conditions of drop-casting in a physically-confined environment.

Next, the platform 100 may be detached from the test substrate 210 and the test substrate 210 provided with the thin film columns 220 may be annealed.

The annealing temperature may vary gradually along a length direction of the columns 220. For example, one end of the test substrate 210 may contact a hot plate 300, while the other end may be exposed to a given temperature, for example, a room temperature lower than the temperature of the hot plate 300, as shown in FIG. 7.

As a result, the thin film columns 220 may exhibit different solvent composition ratios in a transverse direction (I) and different annealing temperatures in a longitudinal direction (II), as shown in FIG. 8.

Referring to FIGS. 9 and 10, a plurality of electrodes 230 may be formed on the thin film columns 220, thereby completing an OTFT array 200 according to an example embodiment. Each pair of electrodes 230 may include a source electrode 232 and a drain electrode 234, and the cross section of the thin film columns 220 may have the same (or substantially the same) cross-section as that shown in FIG. 2. The electrodes 230 may be formed by thermally evaporating a material such as gold using a shadow mask. As shown in FIGS. 9-10, the OTFT array 200 and test substrate 210 optionally may be placed on a supporting block 400.

Figure 11:
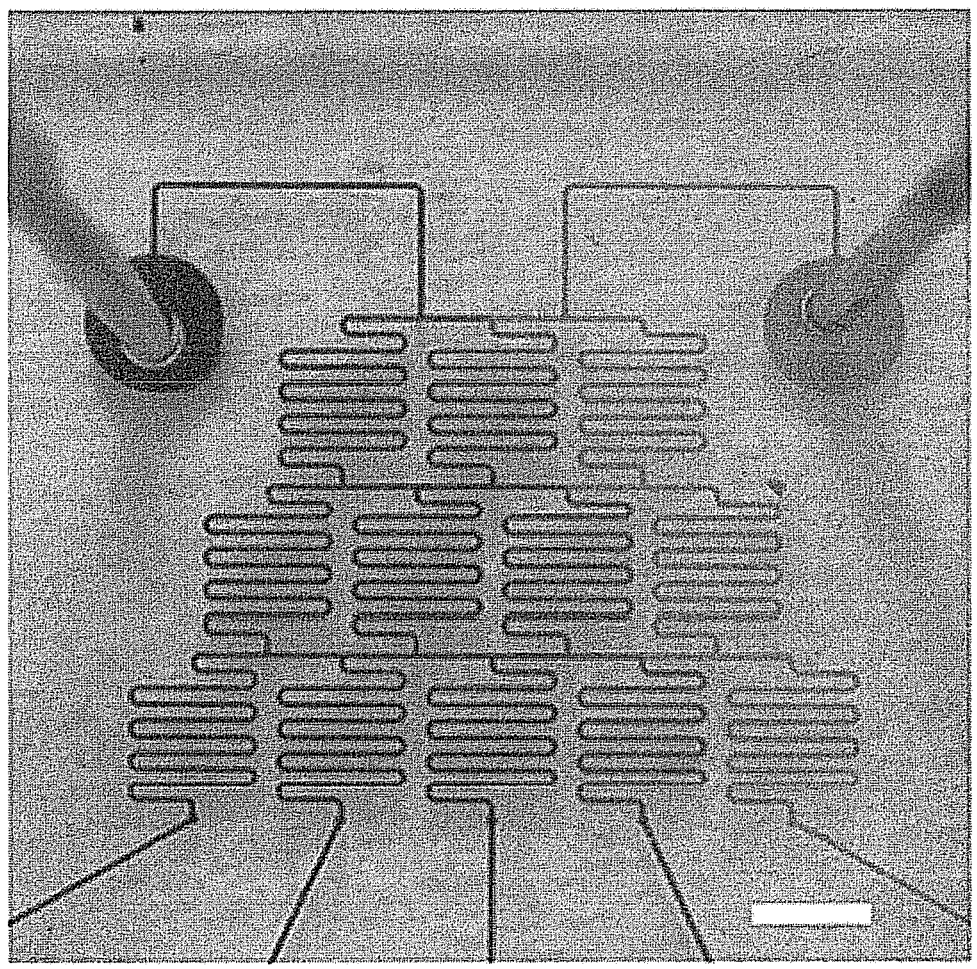
FIG. 11 shows a shape of a branch-off portion in a microchannel structure of a platform according to an experimental example.
Figure 12:
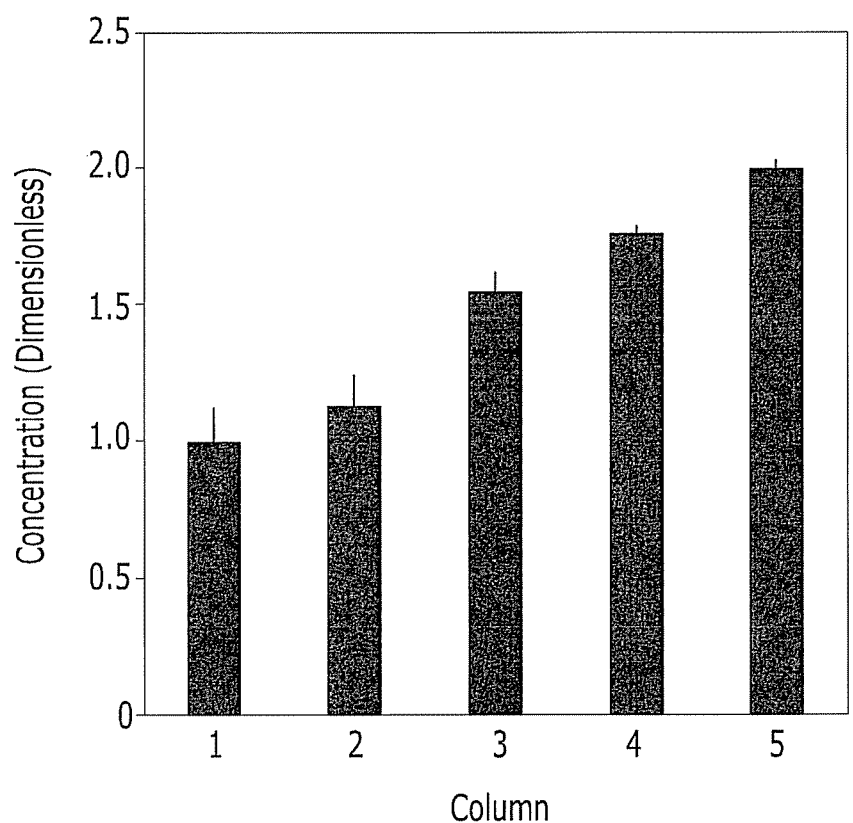
FIG. 12 is a graph illustrating a concentration profile after test solutions fabricated according to an experimental example passed through the branch-off portion.
Figure 13:
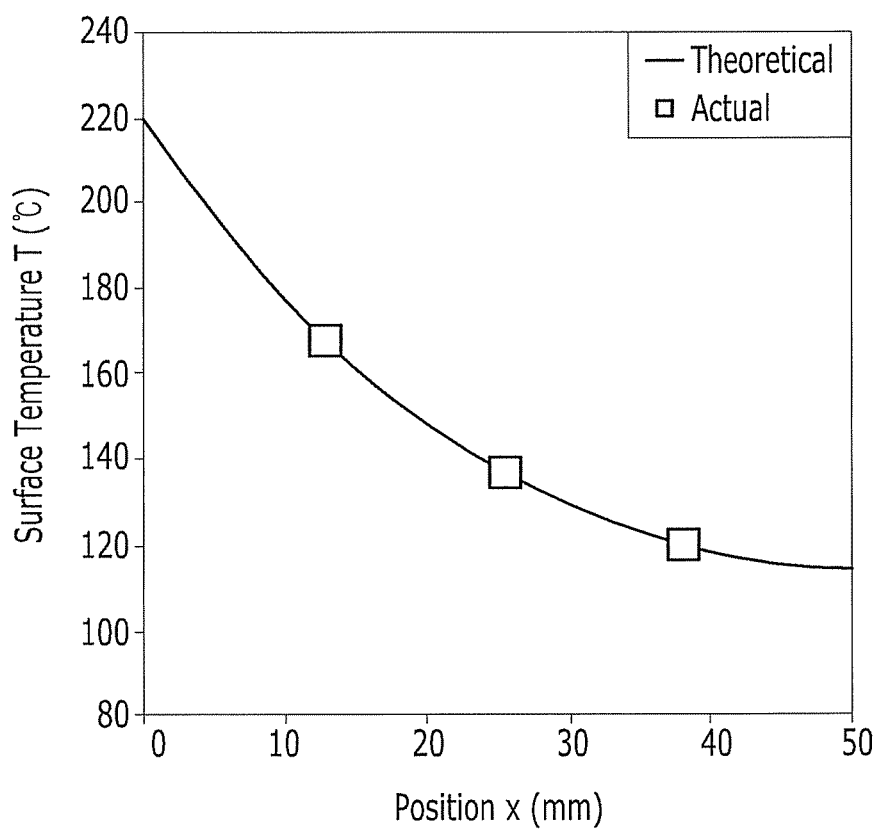
FIG. 13 is a graph showing surface temperature of a test substrate during an annealing process according to an experimental example.
Figure 14:
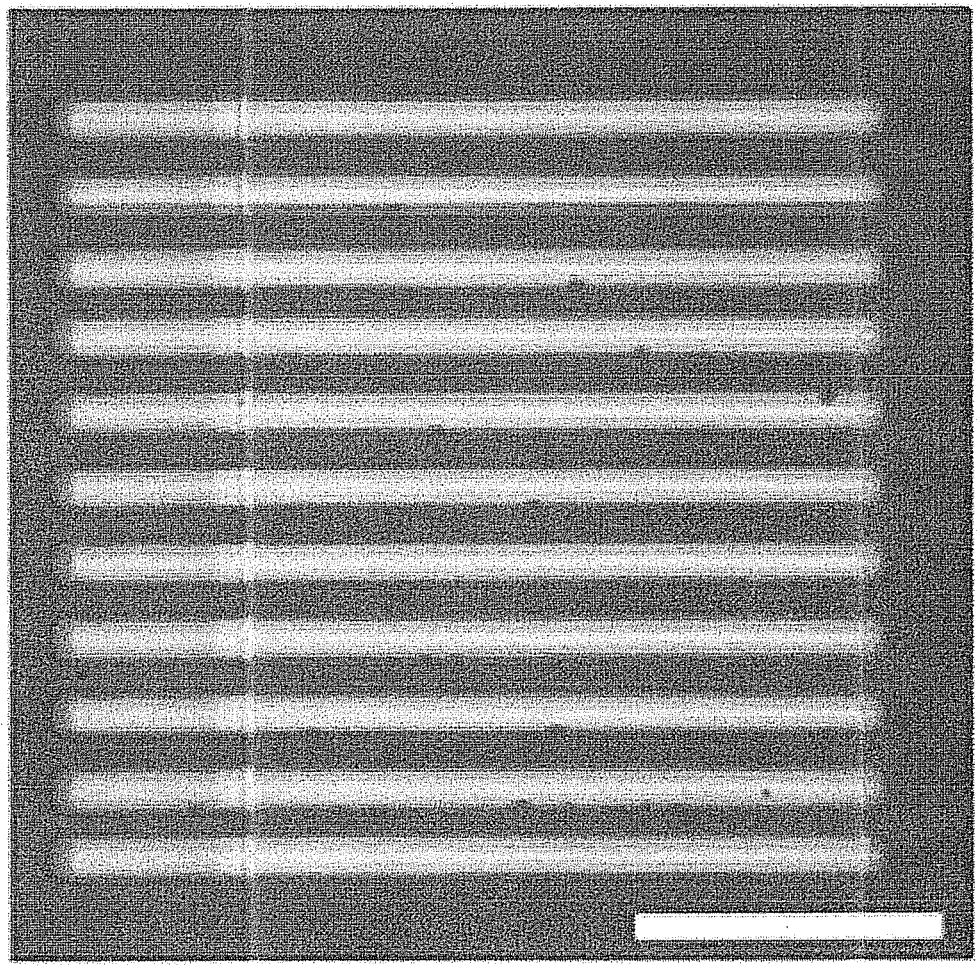
FIG. 14 is an optical microscopy image of OTFTs fabricated according to an experimental example.
Figure 15:
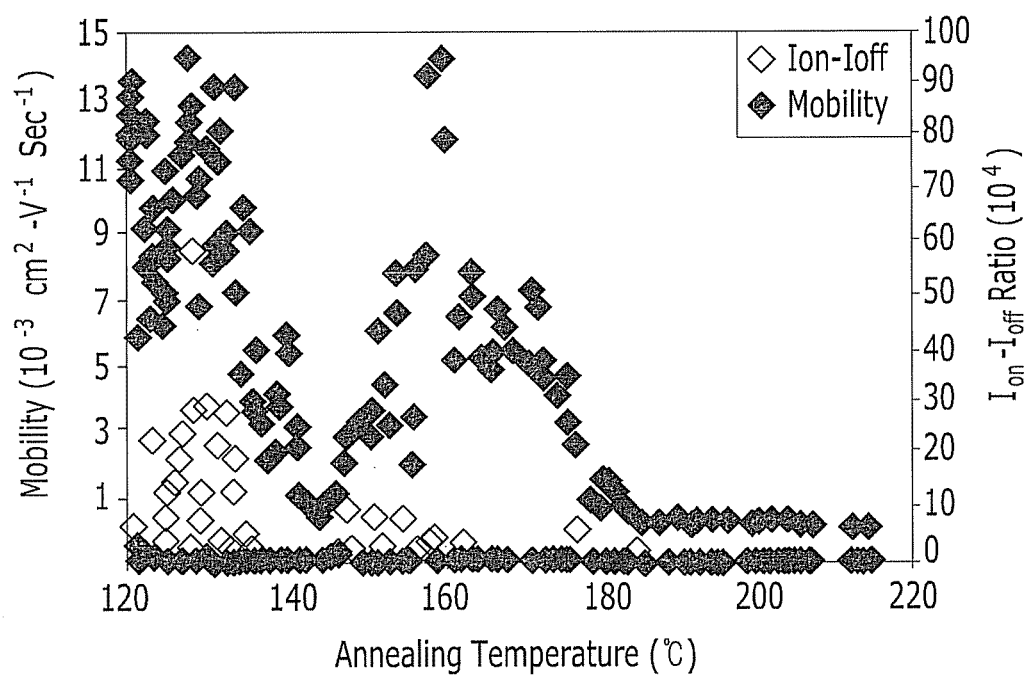
FIG. 15 is a graph showing hole mobility and on-off current ratio ($I_{on}$-$I_{off}$ ratio) of OTFTs prepared from the solution of CB:Ch=13:87 as function of the annealing temperature.
Figure 16:
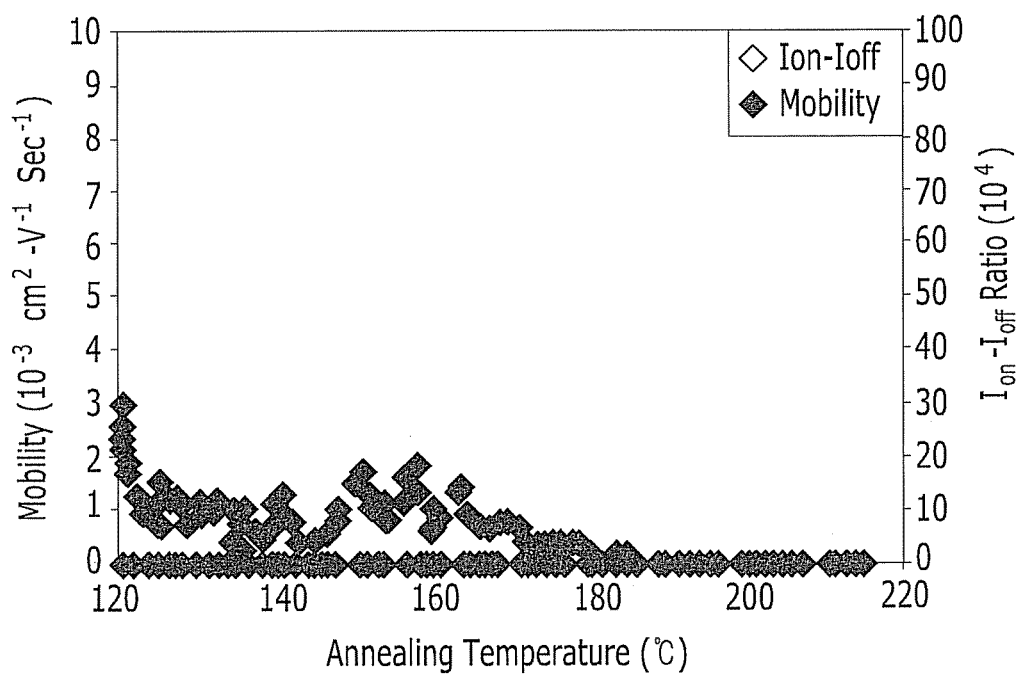
FIG. 16 is a graph showing hole mobility and $I_{on}$-$I_{off}$ ratio of OTFTs prepared from the solution of CB:Ch=0:100 as function of the annealing temperature.
Figure 17:
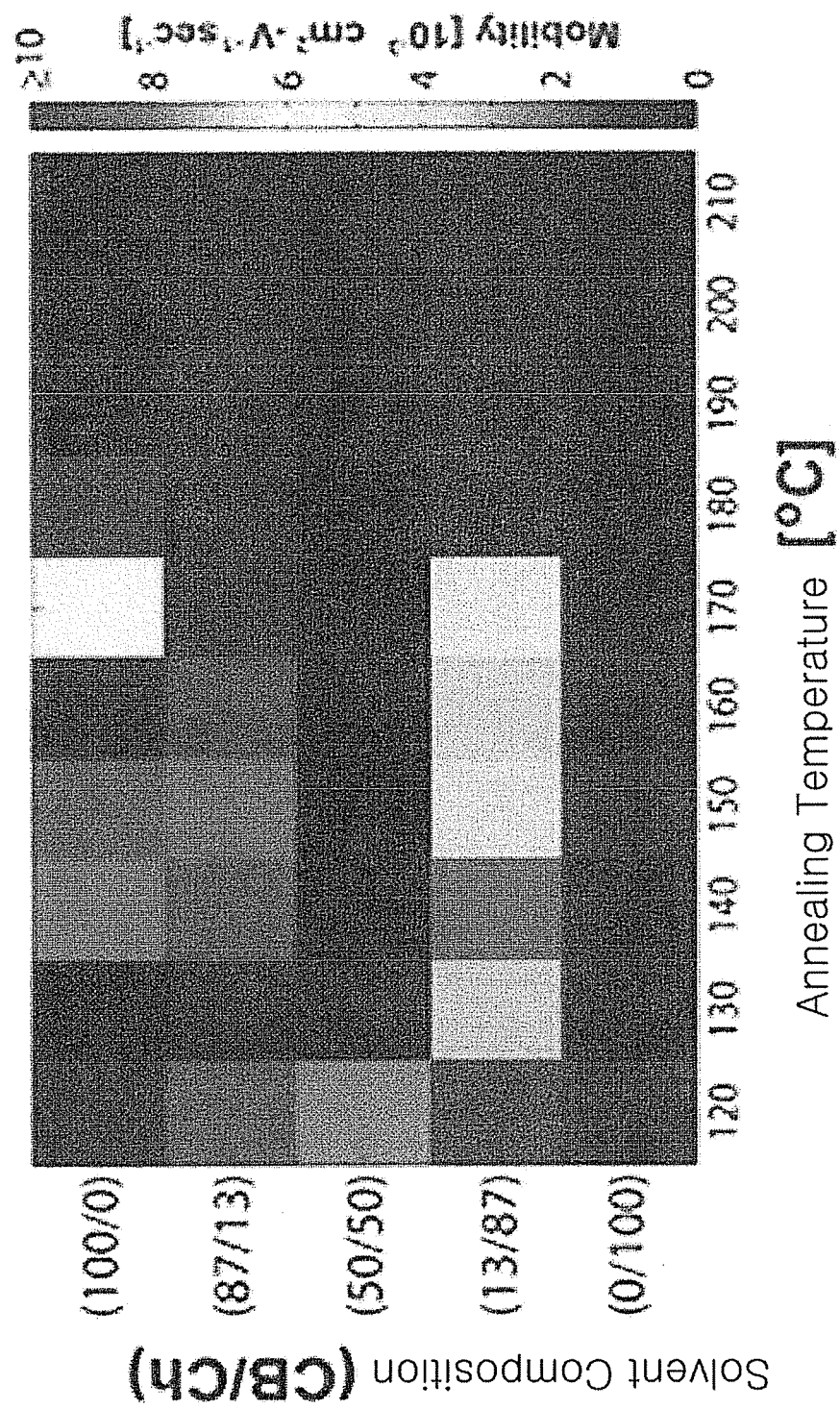
FIG. 17 is a heat map showing hole mobility of organic semiconductor thin film columns as function of annealing temperature and solvent composition ratio according to an experimental example.
Figure 18:
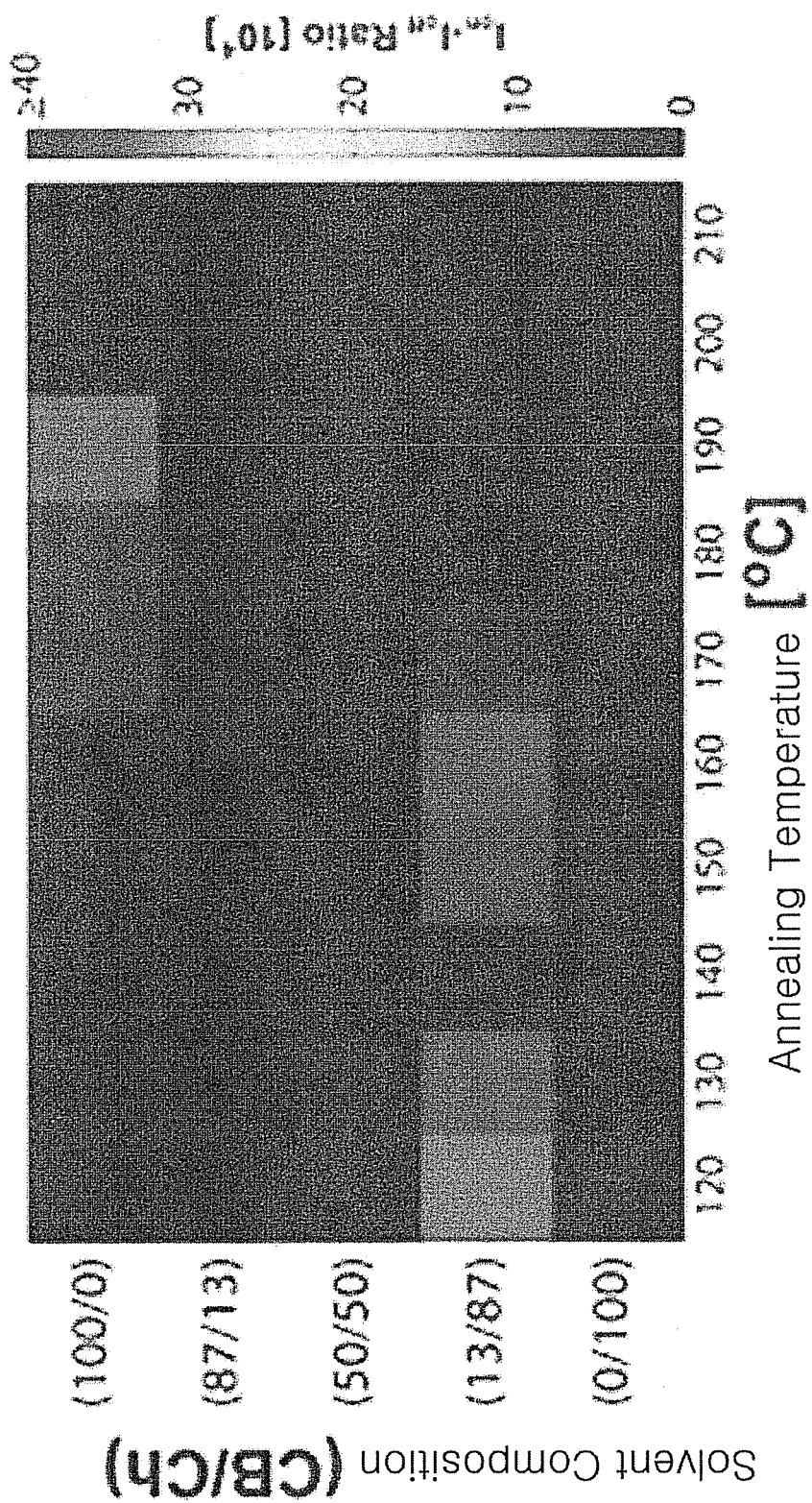
FIG. 18 is a heat map showing $I_{on}$-$I_{off}$ ratio of organic semiconductor thin film columns as function of annealing temperature and solvent composition ratio according to an experimental example.
Figure 19:
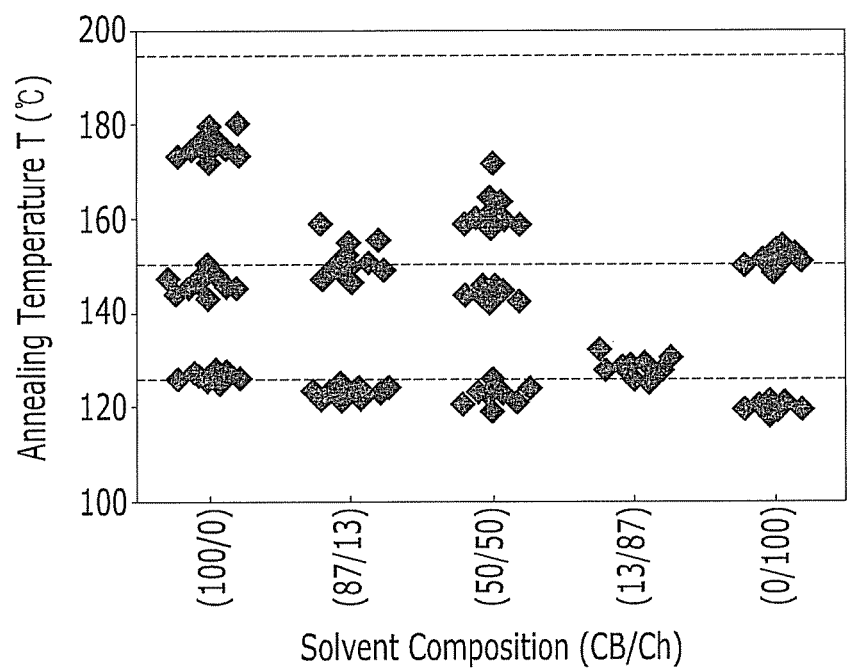
FIG. 19 is a graph showing hole mobility of organic semiconductor thin film columns as function of annealing temperature and solvent composition ratio according to an experimental example.
Figure 20:
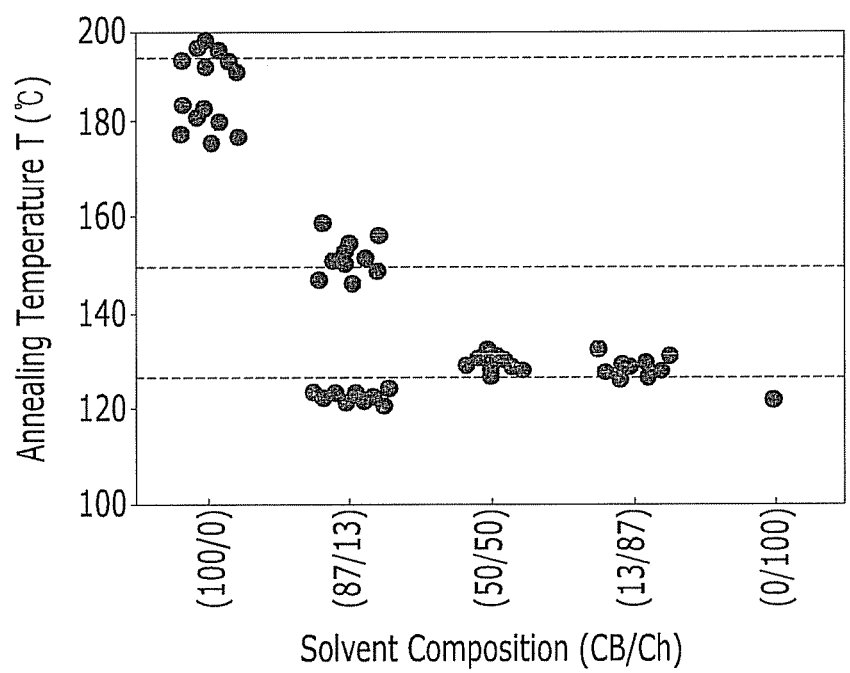
FIG. 20 is a graph showing $I_{on}$-$I_{off}$ ratio of organic semiconductor thin film columns as function of annealing temperature and solvent composition ratio according to this experimental example.

Now, an experimental example related to a method of an OTFT array shown in FIGS. 3 to 10 is described in detail with reference to FIGS. 11 to 20. FIG. 11 shows a shape of a branch-off portion in a microchannel structure of a platform according to an experimental example, FIG. 12 is a graph illustrating concentration profile after test solutions fabricated according to this experimental example passed through the branch-off portion, FIG. 13 is a graph showing surface temperature of a test substrate in annealing according to this experimental example, and FIG. 14 is an optical microscopy image of OTFTs fabricated according to this experimental example. FIG. 15 is a graph showing hole mobility and on-off current ratio ($I_{on}$-$I_{off}$ ratio) of OTFTs prepared from the solution of CB:Ch=13:87 as function of the annealing temperature, and FIG. 16 is a graph showing hole mobility and $I_{on}$-$I_{off}$ ratio of OTFTs prepared from the solution of CB:Ch=0:100 as function of the annealing temperature. FIG. 17 is a heat map showing hole mobility of organic semiconductor thin film columns as function of annealing temperature and solvent composition ratio according to this experimental example, and FIG. 18 is a heat map showing $I_{on}$-$I_{off}$ ratio of organic semiconductor thin film columns as function of annealing temperature and solvent composition ratio according to this experimental example. FIG. 19 is a graph showing hole mobility of organic semiconductor thin film columns as function of annealing temperature and solvent composition ratio according to this experimental example, and FIG. 20 is a graph showing $I_{on}$-$I_{off}$ ratio of organic semiconductor thin film columns as function of annealing temperature and solvent composition ratio according to this experimental example.

First, a microfluidic masters were fabricated using soft lithography, and a PFPE platform 100' and a test substrate 210 were prepared. A branch-off portion 126' of a microchannel structure 120' in the platform 100' includes four stages like FIG. 5, but has a detailed structure different from that shown in FIG. 5. In particular, the main passages C'ij are not rectilinear, but serpentine as shown in FIG. 11.

In order to verifying the microchannel structure 120' of the platform 100' as expected, fluorescein dye (manufactured by Sigma, St. Louis, Mo., USA) was dissolved into water to form test aqueous solutions of concentrations of about 5.7 μg/mL and about 12.4 μg/mL. The two test solutions were injected into injection holes 124' at about 100 μL/min per channel. Absorbance measurements were made using a Cary 6000i Spectrophotometer (Varian, Palo Alto, Calif., USA) at 495 nm and compared to normalized standard solutions.

As a result, the proper operation of the microchannel structure 120' was verified qualitatively as shown in FIG. 11 and quantitatively as shown in FIG. 12.

In detail, the colors of the two solutions injected into left and right injection holes 124' were substantially black and orange, respectively. The colors of the solutions flowing in the five main passages of the last stage changed gradually from black to orange from left to right as shown in FIG. 11. The length of a white bar shown in FIG. 11 indicates one millimeter.

Referring to FIG. 12, when the solution concentration of a leftmost column of the column portion 122 shown in FIG. 3 was assumed to be about 1.0 and the solution concentration of a rightmost column was assumed to be about 2.0, the concentration became higher from left to right. The measured concentration compared is shown in FIG. 12.

The organic semiconductor, PQTBTz-C12 (molecular weight, Mw=22 kDa), was used for solutions 1 and 2 by dissolving PQTBTz-C12 in CB and Ch to form a solution 1 and a solution 2. CB and Ch were chosen as model solvents to achieve a wide range of evaporation rates, which is significant for transistor performance. The concentration of the two solutions was about 20 μg PQTBTz-C12/mL, and organic semiconductor thin film columns 220 produced from concentrations of less than 20 μg PQTBTz-C12/mL exhibited sporadic coverage and reduced device yield.

The solutions were filtered using a 0.2 μm polytetrafluoroethylene (PTFE) filter, loaded into syringes, and flowed through Teflon tubing into the injection holes 124' at a volumetric flow rate of about 100 μL/min. The test substrate 210 with the platform 100 still affixed was immediately placed into an $N_2$ atmosphere to allow solvent evaporation for 24 hours, thereby forming thin film columns 220. All processing thereafter was performed in the $N_2$ atmosphere unless otherwise noted.

The morphology of the thin film columns 220 was characterized by atomic force microscopy (AFM) and their thicknesses were measured by profilometry. Over 90% of the average film thicknesses of the thin film columns 220 was between about 20 nm and about 100 nm. A thin film column 220 processed from pure Ch, that is, the rightmost thin film column 220 was relatively thicker in regions in the immediate vicinity of the outlet compared to other regions in the microchannel structure.

The solvent evaporation is inferred to be spatially uniform as assessed by the tight distribution of thicknesses of the thin film columns 220. Therefore, the evolution of the semiconductor solution into the thin film columns 220 is hypothesized to approximate the conditions of drop-casting.

After detaching the platform 100 from the test substrate 210, the test substrate 210 was placed on the hot plate 300 to form a silicon fin that had a thickness of about 300 nm and an effective length of about 50.5 mm. The hot plate 300 was heated until its surface temperature became about 280° C., and the test substrate 210 was annealed for about 30 min at this temperature at which point the surface temperature of the hot plate 300 was cooled at an average rate of about 2° C./min.

Steadystate surface temperatures of the test substrate 210 were measured at specific points using a digital thermometer, and the surface temperature profile shown in FIG. 13 was obtained by interpolation. In the interpolation, the silicon substrate was modeled as a fin with convective flux at the tip. In FIG. 13, the position x was the distance from the hot plate 300, and the surface temperature varied from about 280° C. to about 120° C. depending on the distance. The range of the annealing temperature was designed to capture the broad range of phase transitions that were observed in PQTBTz-C12. Larger temperature ranges can be realized by increasing the length of the fin and adjusting the temperature of the hot plate 300 and ambient atmosphere.

Finally, an OFTF array was completed by the thermal deposition of gold through a shadow mask to form electrodes 230. The width-to-length ratio was about 20, and the number of the OTFTs was over 800. FIG. 14 shows an optical microscopy image of the OTFTs including the thin film columns 220 prepared from pure Ch, i.e., the rightmost column 220 shown in FIG. 9. In FIG. 14, a pair of yellow longitudinal lines indicate left and right boundaries of the thin film columns 220, and the white scale bar represents 1 mm.

The electrical characteristics of the fabricated OTFTs were analyzed according to the solvent composition and the annealing temperature. Electrical measurements were performed in an $N_2$ atmosphere using a Keithley 4200SCS semiconductor parameter analyzer.

FIG. 15 shows hole mobility and on-off current ratio ($I_{on}$-$I_{off}$ ratio) of OTFTs prepared from the solution of CB:Ch=13:87 as function of the annealing temperature. FIG. 16 shows hole mobility and $I_{on}$-$I_{off}$ ratio of OTFTs prepared from the solution of CB:Ch=0:100 as function of the annealing temperature.

In FIGS. 15 and 16, the hole mobility of the OTFTs were observed to be on the order of about $2\times10^{-3}$ cm$^2$/Vsec with peak values of up to about $1.5\times10^{-2}$ cm$^2$/Vsec. Typical $I_{on}$-$I_{off}$ ratios were on the order of $5\times10^3$ with peak values up to $1\times10^6$. In FIG. 15, the mobility and $I_{on}$-$I_{off}$ ratios were high when the annealing temperature was from about 120° C. to about 135° C. However, in FIG. 16, the mobility and $I_{on}$-$I_{off}$ ratios did not show significant variation depending on the annealing temperature.

As described above, the performance of the OFTFs was sensitive to the solvent composition and the annealing temperature. It is summarized as in FIGS. 17 to 20.

PQTBTz-C12 is a donor-acceptor copolymer with a mesophase, i.e., liquid crystalline phase. The solid-to-mesophase transition and the mesophase-to-isotropic transition occur at approximately 149° C. and 195° C., respectively, for Mw=22 kDa. The device performance in OTFTs fabricated from PQTBTz-C12 was anticipated to exhibit strong temperature dependence across this range of annealing temperatures.

The thin film columns 220 processed from pure CB (CB/Ch 100/0) exhibit local peaks in the mobility at annealing temperatures of approximately 150° C. and 175° C. Peaks at annealing temperatures of 150° C., which corresponds to the solid-to-mesophase transition temperature, were mostly conserved as the solvent composition incorporated more chloroform. However, peaks at annealing temperatures of 175° C. vanished as the solvent composition incorporated chloroform.

Similarly, peak $I_{on}$-$I_{off}$ ratios were observed at annealing temperatures of approximately 194° C., which corresponds to the mesophase-to-isotropic transition, for a solvent composition of CB/Ch (100/0); however, this feature was also abolished as Ch was introduced into the solvent.

Additionally, there were consistent observations of local maxima in the mobility as annealing temperatures of approximately 120-130° C. These peaks were mostly conserved across solvent composition, with the notable exception of the OTFTs processed from CB/Ch (0/100). Peaks in $I_{on}$-$I_{off}$ ratio were also observed in this temperature range for OTFTs processed from CB/Ch (50/50) and CB/Ch (0/100). This suggests that there may be another morphological alteration at about 125° C.

PQTBTz-C12 thin film columns 220 prepared from the microfluidic array platform 100 exhibit a process-dependent morphology, which is likely to manifest itself through differential electrical properties. The thin-film columns 220 each, respectfully, include a different morphology, and the morphology of each of the thin-film columns 220 varies along a length direction of the thin-film columns 220. For example, the thin films prepared from CB/Ch (87/13) solvent exhibit a pronounced fibrillar morphology. This morphology lies in strong contrast to the thin films processed from CB/Ch (13/87), which exhibit a globular morphology. Furthermore, these morphologies are conserved within each respective solvent system upon thermal annealing between approximately 120° C. and 150° C. However, the significant film coarsening is observed as the annealing temperature is increased.

In consideration of the above-described results, it seems that it is proper to use the solvent of CB:Ch=100:0, which exhibits both high hole mobility and high $I_{on}$-$I_{off}$ ratio, in the solution process of PQTBTz-C12 (Mw=22 kDa).

Organic semiconductors and solvents selected through the above-described process can be used in manufacturing OTFTs having a structure shown in FIG. 1 or 2, or another structure.

The microfludic platform 100 used in the above-described embodiments may be also used in other electric devices such as organic solar cells or organic light emitting devices. A method of manufacturing an organic solar cell using the platform 100 is now described in detail with reference to FIG. 21.

FIG. 21 is a schematic sectional view of an organic solar cell according to an example embodiment.

Referring to FIG. 21, an organic solar cell 30 according to an example embodiment includes an organic semiconductor layer 32 disposed on a substrate 31 and lower and upper electrodes 36 and 38 contacting respective sides of the semiconductor layer 32. The organic semiconductor layer 32 includes an n-type (or p-type) semiconductor region 33 and a p-type (or n-type) semiconductor region 34 that have bulk-like junction, and may be formed by a solution process. The lower electrode 36 may include a metal such as gold, and the upper electrode 38 may include a transparent conductive material such as indium-tin-oxide (ITO).

The shape of the two semiconductor regions 33 and 34 including their boundaries may vary according to materials and process conditions, and may cause in the different electrical properties of the solar cell. In order to find out materials and process conditions giving suitable electrical properties, the platform 100 with the microchannel structure 120 shown in FIGS. 3 to 10 may be used to obtain a test solar cell array.

A structure of solar cells in a test solar cell array may have a structure the same (or substantially the same) as or different from that shown in FIG. 21. Hereinafter, assuming that solar cells in a test solar cell array have the same (or substantially the same) structure shown in FIG. 21, a method of manufacturing a test solar cell array is described in detail with reference to FIGS. 3 to 8.

Referring to FIG. 3C, electrodes 36 are formed on a test substrate 31 to create a test substrate 210". A platform 100 including a microchannel structure 120 is attached thereto. A solution 1 and a solution 2 including semiconductor materials are injected into two injection holes 124 of the platform 100.

The solution 1 and the solution 2 may include different organic semiconductor materials, for example, a p-type semiconductor material and an n-type semiconductor material. The solution 1 and the solution 2 may include the same or different solvents. Examples of p-type semiconductor material include pentacene, copper phthalocyanine (CuPc), tetracyanoquinodimethane (TCNQ), TIPS pentacene, P3HT, poly-phenylene vinylene (PPV), and poly[2,5-bis(3-alkylthiophen-2-yl)thieno(3,2-b)thiophene](PBTTT). Examples of n-type semiconductor are phenyl-C61-butyric acid methyl ester (PCBM), C60, and perylenediimide (PDI) derivatives, etc. Examples of solvents include chlorobenzene, chloroform, toluene, benzene, THF, $CCl_4$, methylenechloride, ethylacetate, and a combination of the above-described solvents.

The two solutions flow through a branch-off portion 126 to be mixed with each other, and solutions flowing in a column portion 122 may include a solute composition having various composition ratios.

Next, the solvent is evaporated, and annealing process may be performed as shown in FIG. 7 to form a plurality of organic semiconductor layers 32 including semiconductor regions 33 and 34 having various shapes according to the solute composition ratio and the annealing temperature. Thereafter, electrodes 38 may be formed to complete a test solar cell array and the characteristics of solar cells may be measured and evaluated.

The amounts of p-type semiconductor material and n-type semiconductor material contained in the solution 1 and the solution 2 may be different from each other. For example, when the amount of the p-type semiconductor material is greater than the amount of the n-type semiconductor material, the semiconductor region 33 may be p-type, while the semiconductor region 34 may be n-type. On the contrary, when the amount of the p-type semiconductor material is smaller than the amount of the n-type semiconductor material, the semiconductor region 33 may be n-type, while the semiconductor region 34 may be p-type.

The solute composition ratio and the annealing temperature selected through the characteristic test of the solar cells in the test solar cell array may be used in manufacturing actual organic solar cells.

Although it is described above that the annealing temperature varies along the thin film columns 220 in the test elective device array, other process conditions may also vary. For example, different electric fields may be applied along the thin film columns 220 during the annealing. An electric field applied to the thin film columns 220 to cause polarization, and the degree of the polarization may change depending on the strength of the electric field, which causes different characteristics of electric devices.

Not only one process condition, but two or more process conditions may be varied along the thin film columns. For example, both the annealing temperature and the strength of the applied field may vary along the thin film columns.

As described above, several electric devices prepared from different process conditions may be obtained at a time by manufacturing an electric device array using a microfluidic platform, and thus the characteristic test may be performed quickly and precisely.

While some example embodiments have been particularly shown and described, it will be understood by one of ordinary skill in the art that variations in form and detail may be made therein without departing from the spirit and scope of the appended claims.

What is claimed is:

1. A method of manufacturing an array of electric devices, comprising:
    attaching a platform including a micro-channel structure to a substrate;
    injecting a first solution and a second solution into the micro-channel structure to form at least three liquid film columns on the substrate,
        the first solution and the second solution each, respectfully, including a different solvent composition ratio, and
        the liquid film columns each, respectfully, including a different solvent composition ratio;
    removing solvent from the liquid film columns to form thin film columns;
    detaching the platform from the substrate; and
    treating the thin film columns under different conditions along a length direction of the thin film columns.

2. The method of claim 1, wherein
    the thin film columns include at least one organic semiconductor, and
    the method further includes connecting a plurality of electrodes to the thin film columns.

3. The method of claim 2, wherein the treating the thin film columns comprises:
    annealing the thin film columns.

4. The method of claim 3, wherein the annealing the thin film columns comprises a process that varies an annealing temperature along a length direction of the thin film columns, the process including:
    contacting a first end of the substrate to a hot plate, and exposing a second end of the substrate to a temperature lower than a temperature of the hot plate,
    the second end opposite the first end.

5. The method of claim 4, wherein
    the plurality of electrodes include a source electrode and a drain electrode,
    the source electrode disposed opposite the drain electrode relative to a length direction of the thin film columns.

6. The method of claim 5, wherein
    the first solution and the second solution include the at least one organic semiconductor in common,
    the first solution further includes a first solvent, and
    the second solution further comprises a second solvent.

7. The method of claim 6, wherein
the at least one organic semiconductor includes poly(didodecylquaterthiophene-alt-didodecylbithiazole),
the first solvent includes chlorobenzene, and the second solvent includes chloroform.

8. The method of claim 4, wherein
the plurality of electrodes includes a plurality of pairs of upper electrodes and lower electrodes,
the upper electrodes are disposed on the thin film columns, and
the lower electrodes are disposed between the thin film columns and the substrate.

9. The method of claim 8, wherein
the at least one organic semiconductor includes a p-type organic semiconductor and an n-type organic semiconductor,
the first solution and the second solution include a solvent in common, the first solution includes the p-type organic semiconductor, and
the second solution includes the n-type organic semiconductor.

10. The method of claim 9, wherein
the p-type organic semiconductor includes at least one of pentacene, copper phthalocyanine (CuPc), tetracyanoquinodimethane (TCNQ), 6,13-bis(triisopropylsilylethynyl) (TIPS) pentacene, poly(3-hexylthiophene) (P3HT), poly-phenylene vinylene (PPV), and poly[2,5-bis(3-alkylthiophen-2-yl)thieno(3,2-b)thiophene] (PBTTT);
the n-type organic semiconductor includes at least one of phenyl-C61-butyric acid methyl ester (PCBM), C60, and perylenediimide (PDI) derivatives; and
the solvent includes at least one of chlorobenzene, chloroform, toluene, benzene, tetrahydrofuran (THF), $CCl_4$, methylenechloride, and ethylacetate.

11. A method of manufacturing an organic electric device, comprising:
selecting a solvent and a solute,
forming a organic semiconductor thin film on a first substrate by a solution process using the selected solvent and a solute; and
forming a pair of first electrodes contacting the thin film,
wherein the selection comprises:
attaching a platform including a micro-channel structure to a second substrate,
injecting a first solution and a second solution into the micro-channel structure to form at least three liquid film columns,
the first solution and the second solution each, respectfully, including a different solvent composition ratio, and
the liquid film columns each, respectfully, including a different solvent composition ratio,
removing the solvent from the liquid film columns to form thin film columns,
detaching the platform from the second substrate, and
treating the thin film columns under different conditions along length direction of the thin film columns;
connecting a plurality of second electrodes to the thin film to create test organic electric devices;
testing characteristics of the test organic electric devices; and
selecting the solvent and solute based on the tested characteristics.

12. The method of claim 11, wherein the treatment of the thin film columns comprises:
annealing the thin film columns under different temperatures along a length direction of the thin film columns.

13. The method of claim 12, wherein the annealing the thin film columns comprises a process that varies an annealing temperature along a length direction of the thin film columns, the process including:
contacting a first end of the second substrate to a hot plate, and
exposing a second end of the second substrate to a temperature lower than a temperature of the hot plate, the second end opposite the first end.

14. The method of claim 13, wherein
the plurality of second electrodes include a source electrode and a drain electrode, the source electrode disposed opposite the drain electrode relative to a length direction of the thin film columns.

15. The method of claim 14, wherein
the first solution and the second solution include the at least one organic semiconductor in common,
the first solution further includes a first solvent, and the second solution further includes a second solvent.

16. The method of claim 15, wherein
the at least one organic semiconductor includes poly(didodecylquaterthiophene-alt-didodecylbithiazole),
the first solvent includes chlorobenzene, and
the second solvent includes chloroform.

17. The method of claim 13, wherein
the plurality of second electrodes include a plurality of pairs of upper electrodes and lower electrodes,
the upper electrodes are disposed on the thin film columns, and
the plurality of lower electrodes are disposed between the thin film columns and the second substrate.

18. The method of claim 17, wherein
the first solution and the second solution include a solvent in common,
the first solution further includes a p-type organic semiconductor as a solute, and
the second solution further includes a n-type organic semiconductor as a solute.

19. The method of claim 18, wherein
the p-type organic semiconductor includes at least one of pentacene, copper phthalocyanine (CuPc), tetracyanoquinodimethane (TCNQ), 6,13-bis(triisopropylsilylethynyl) (TIPS) pentacene, poly(3-hexylthiophene) (P3HT), poly-phenylene vinylene (PPV), and poly[2,5-bis(3-alkylthiophen-2-yl)thieno(3,2-b)thiophene] (PBTTT);
the n-type organic semiconductor includes at least one of phenyl-C61-butyric acid methyl ester (PCBM), C60, and perylenediimide (PDI) derivatives; and
the solvent includes at least one of chlorobenzene, chloroform, toluene, benzene, tetrahydrofuran (THF), $CCl_4$, methylenechloride, and ethylacetate.

\* \* \* \* \*